(12) United States Patent
Chou et al.

(10) Patent No.: US 7,397,121 B2
(45) Date of Patent: Jul. 8, 2008

(54) SEMICONDUCTOR CHIP WITH POST-PASSIVATION SCHEME FORMED OVER PASSIVATION LAYER

(75) Inventors: Chiu-Ming Chou, Kao-hsiung (TW); Chien-Kang Chou, Tainan Hsien (TW); Ching-San Lin, Wufong Township, Taichung County (TW); Mou-Shiung Lin, Hsinchu (TW); Hsin-Jung Lo, Jhonghe (TW)

(73) Assignee: Megica Corporation, Hsin-Chu (TW)

( * ) Notice: Subject to any disclaimer, the term of this patent is extended or adjusted under 35 U.S.C. 154(b) by 191 days.

(21) Appl. No.: 11/262,184

(22) Filed: Oct. 28, 2005

(65) Prior Publication Data

US 2007/0096313 A1    May 3, 2007

(51) Int. Cl.
*H01L 23/48* (2006.01)

(52) U.S. Cl. .................. 257/737; 257/780; 257/784; 257/E23.021

(58) Field of Classification Search ................. 257/780, 257/781, 784, E23.021, 737
See application file for complete search history.

(56) References Cited

U.S. PATENT DOCUMENTS

| | | | | |
|---|---|---|---|---|
| 6,620,728 | B2* | 9/2003 | Lin | 438/637 |
| 6,861,762 | B1* | 3/2005 | Rotem | 257/778 |
| 2004/0029404 | A1* | 2/2004 | Lin | 438/958 |
| 2004/0166659 | A1* | 8/2004 | Lin et al. | 438/611 |
| 2005/0017343 | A1* | 1/2005 | Kwon et al. | 257/698 |
| 2005/0121804 | A1* | 6/2005 | Kuo et al. | 257/781 |

* cited by examiner

*Primary Examiner*—Tuan N. Quach

(57) ABSTRACT

The invention provides a semiconductor chip comprising an interconnecting structure over said passivation layer. The interconnecting structure comprises a first contact pad connected to a second contact pad exposed by an opening in a passivation layer. A metal bump is on the first contact pad and over multiple semiconductor devices, wherein the metal bump has more than 50 percent by weight of gold and has a height of between 8 and 50 microns.

20 Claims, 14 Drawing Sheets

SEMICONDUCTOR CHIP WITH POST-PASSIVATION SCHEME FORMED OVER PASSIVATION LAYER

This application is related to Assignee.

BACKGROUND OF THE PRESENT INVENTION

1. Field of Invention

The invention relates to a semiconductor chip, and particularly to a semiconductor chip with a post-passivation scheme formed over a passivation layer.

2. Description of Related Arts

The Au bumps are used for the TCP (tape carrier packaging) and COG (chip on glass) assembly in the LCD driver ICs. Due to the finer pixel demand and ever-increasing panel size, the required number of I/O layouts is increasing. In the conventional design, referring to FIG. 1, the chip 101 includes a single row of IO contact pads 102 exposed by openings in a passivation layer. The IO contact pads 102 are at the periphery of the chip 101. Au bumps 103 are formed on the 10 contact pads 102. There are no semiconductor devices, such MOS devices or transistors, under the IO contact pads 102.

With the increasing of the number of the IOs, the size of the Au bumps 103 have to be shrunk to maintain the chip 101 in a small size. Then it becomes technically difficult and economically expensive in connecting the chip 101 to an external circuitry.

Some designers design the contact pads 202 of the chip 201 aligned in two rows, as shown in FIGS. 2 and 3, with the contact pads 202 exposed by openings in a passivation layer 204. There are no semiconductor devices 205, such MOS devices or transistors, under the contact pads 202 and Au bumps 203, neither. Then the chip 201 cannot be maintained in a small size since the underlying semiconductor substrate 206 vacates a peripheral region 207 having no semiconductor devices.

SUMMARY OF THE PRESENT INVENTION

The objective of the invention is to provide multiple metal bumps that are soft and ductile to buffer and absorb the shock energy during assembling the semiconductor chip and an external circuitry or to buffer and absorb the shock energy during a probe or testing card is poked in the metal bumps. Therefore, the invention allows the semiconductor devices under the metal bumps without being damaged if a shock happens to the metal bumps.

Another objective of the invention is to provide an RDL layer that is employed to change the I/O layout from a fine-pitched contact pad exposed by an opening in the passivation layer to a coarse-pitched contact pad formed over the fine-pitched contact pad or a passivation layer. Therefore, the process for forming a metal bump on the RDL layer is easily performed.

Another objective of the invention is to provide a semiconductor chip where a peripheral region of a semiconductor substrate close to the edge thereof may have semiconductor devices formed therein or on. The rate of the semiconductor devices occupying the top surface of the semiconductor substrate is improved and therefore the semiconductor chip can be shrunk.

DETAILED DESCRIPTION OF THE PREFERRED EMBODIMENT

First Embodiment

Figure 1:
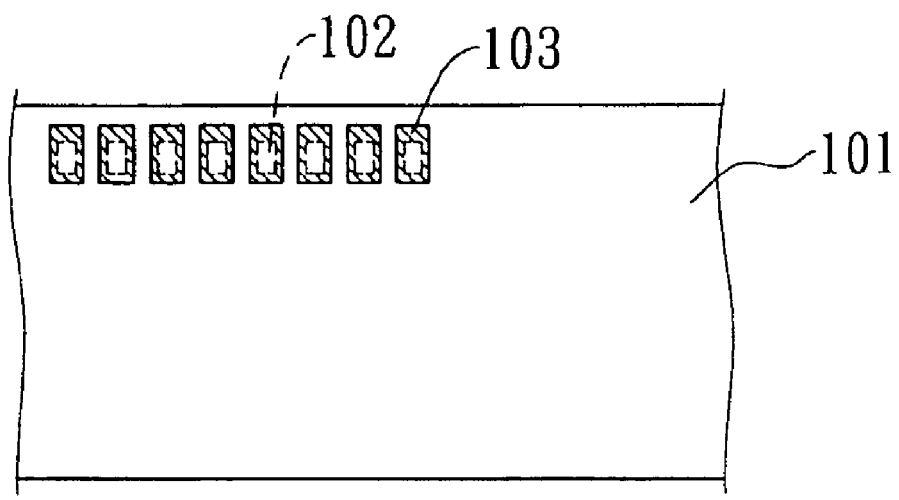
FIG. 1 illustrates a top view of a conventional semiconductor chip.
Figure 2:
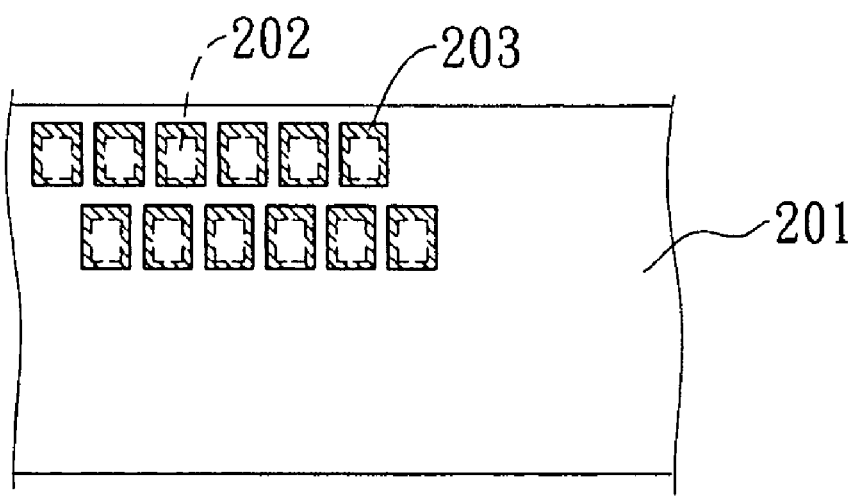
FIG. 2 illustrates a top view of another conventional semiconductor chip.
Figure 3:
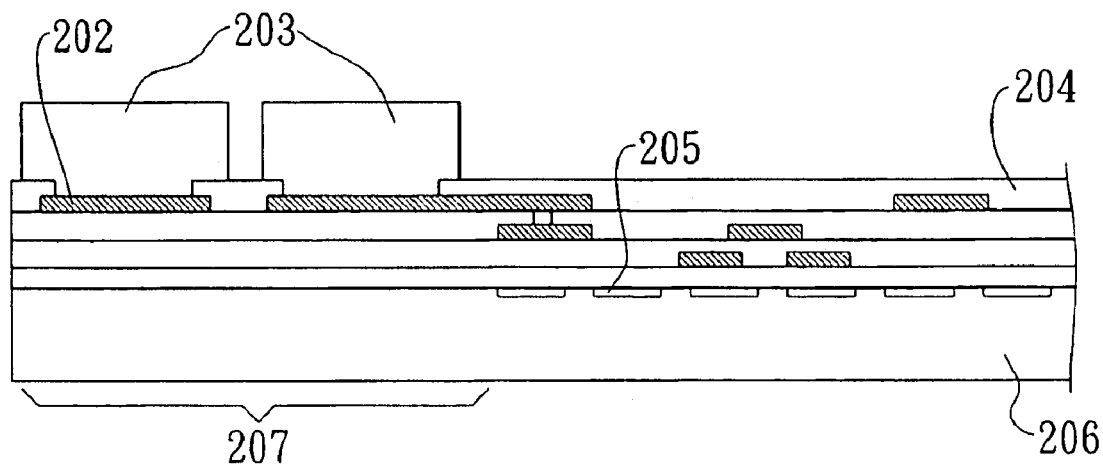
FIG. 3 illustrates s cross-sectional view of FIG. 2.
Figure 4:
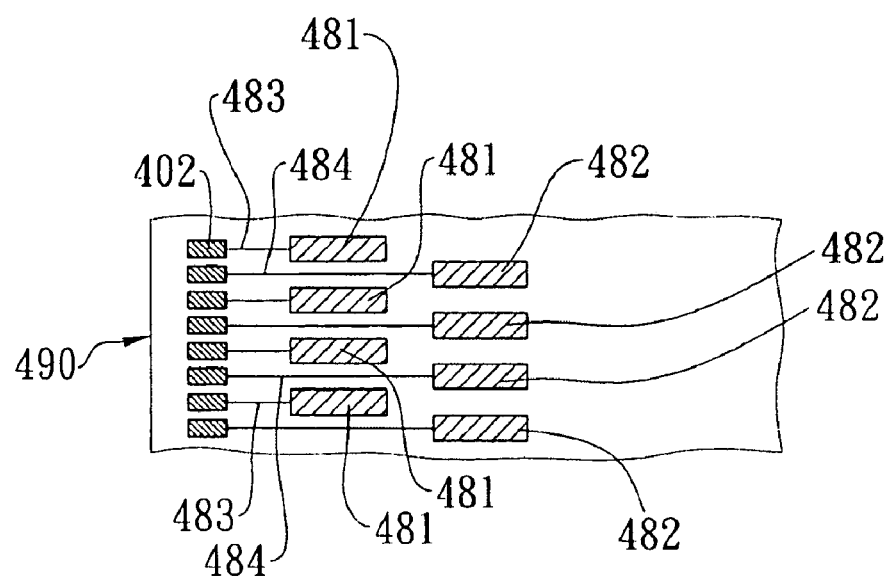
FIG. 4 illustrates a top view of a semiconductor chip according to the invention.
Figure 4A:
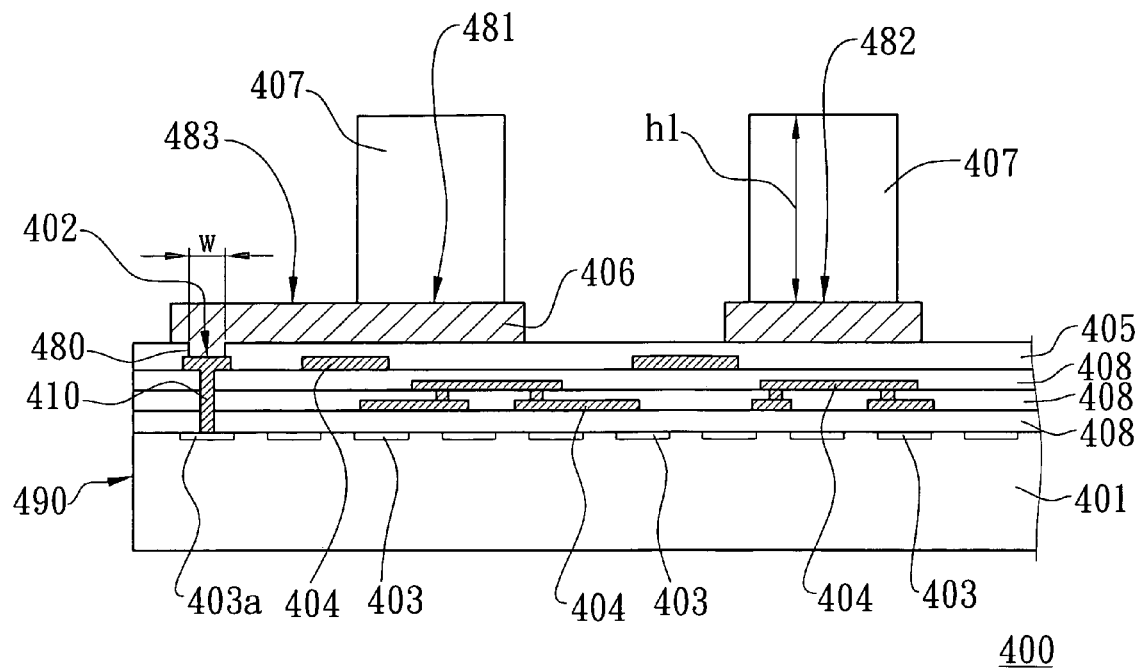
FIG. 4A illustrates a cross-sectional view of FIG. 4.

Referring to FIG. 4A, an embodiment of the invention, it is the cross section of an semiconductor chip 400 including a semiconductor substrate 401, such as silicon substrate, GaAs substrate or SiGe substrate, with multiple semiconductor devices 403, such as CMOS devices, transistors, resistors, capacitors, or inductors, formed therein or on, multiple thin-film dielectric layers 408, such as silicon oxide, over the semiconductor substrate 401, multiple thin-film metal layers 404, formed by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process, and a passivation layer 405 over the thin-film dielectric layers 408 and thin-film metal layers 404, multiple openings 480 in the passivation layer 405 exposing multiple contact pads 402 provided by the topmost one of the thin-film metal layers 404. The openings 480 have a largest transverse dimension w of between 0.1 and 30 microns, for example. The passivation layer 405 should be thick enough to prevent moisture, impurities, mobile ions or transitional metal elements from moving through the passivation layer 405. The passivation layer 405 is constructed of a silicon oxide compound, a silicon nitride compound, phosphosilicate glass (PSG), a silicon oxynitride compound or a composite formed by depositing the above materials.

In a case, the passivation layer 405 can be formed by first depositing a silicon-oxide layer with a thickness of between 0.2 and 1.0 microns using a PECVD process, then depositing a silicon-nitride layer with a thickness of between 0.2 and 1.0 microns on the silicon-oxide layer using a PECVD process.

In another case, the passivation layer 405 can be formed by first depositing a silicon-oxide layer with a thickness of between 0.2 and 1.0 microns using a PECVD process, then depositing a silicon-oxynitride layer with a thickness of between 0.05 and 0.5 microns on the silicon-oxide layer using a PECVD process, and then depositing a silicon-nitride layer with a thickness of between 0.2 and 1.0 microns on the silicon-oxynitride layer using a PECVD process.

In another case, the passivation layer 405 can be formed by first depositing a silicon-oxynitride layer with a thickness of between 0.05 and 0.5 microns using a PECVD process, then depositing a silicon-oxide layer with a thickness of between 0.2 and 1.0 microns on the silicon-oxynitride layer using a PECVD process, and then depositing a silicon-nitride layer with a thickness of between 0.2 and 1.0 microns on the silicon-oxide layer using a PECVD process.

In another case, the passivation layer 405 can be formed by first depositing a silicon-oxide layer with a thickness of between 0.2 and 1.0 microns using a PECVD process, then depositing a silicon-oxide layer with a thickness of between 0.5 and 3.0 microns on the PECVD silicon-oxide layer using a spin-coating process, then depositing a silicon-oxide layer with a thickness of between 0.2 and 1.0 microns on the spin-coated silicon-oxide layer using a PECVD process, and then depositing a silicon-nitride layer with a thickness of between 0.2 and 1.0 microns on the PECVD silicon-oxide layer using a PECVD process.

In another case, the passivation layer 405 can be formed by first depositing a silicon-oxide layer with a thickness of between 0.5 and 3.0 microns using a HDP-CVD process, and then depositing a silicon-nitride layer with a thickness of between 0.2 and 1.0 microns on the silicon-oxide layer using a PECVD process.

In another case, the passivation layer 405 can be formed by first depositing a USG layer with a thickness of between 0.2 and 3 microns, then depositing a layer of TEOS, BPSG or PSG with a thickness of between 0.5 and 3 microns on the USG layer, and then depositing a silicon-nitride layer with a thickness of between 0.2 and 1.0 microns on the layer of TEOS, BPSG or PSG using a PECVD process.

In another case, the passivation layer 405 can be formed by optionally first depositing a first silicon-oxynitride layer with a thickness of between 0.05 and 0.5 microns on the silicon-oxide layer using a PECVD process, then depositing a silicon-oxide layer with a thickness of between 0.2 and 1.0 microns optionally on the first silicon-oxynitride layer using a PECVD process, then optionally depositing a second silicon-oxynitride layer with a thickness of between 0.05 and 0.5 microns on the silicon-oxide layer using a PECVD process, then depositing a silicon-nitride layer with a thickness of between 0.2 and 1.0 microns on the second silicon-oxynitride layer or on the silicon-oxide layer using a PECVD process, then optionally depositing a third silicon-oxynitride layer with a thickness of between 0.05 and 0.5 microns on the silicon-nitride layer using a PECVD process, and then depositing a silicon-oxide layer with a thickness of between 0.2 and 1.0 microns on the third silicon-oxynitride layer or on the silicon-nitride layer using a PECVD process.

In another case, the passivation layer 405 can be formed by first depositing a first silicon-oxide layer with a thickness of between 0.2 and 1.0 microns using a PECVD process, then depositing a second silicon-oxide layer with a thickness of between 0.5 and 3.0 microns on the first silicon-oxide layer using a spin-coating process, then depositing a third silicon-oxide layer with a thickness of between 0.2 and 1.0 microns on the second silicon-oxide layer using a PECVD process, then depositing a silicon-nitride layer with a thickness of between 0.2 and 1.0 microns on the third silicon-oxide layer using a PECVD process, and then depositing a fourth silicon-oxide layer with a thickness of between 0.2 and 1.0 microns on the silicon-nitride layer using a PECVD process.

In another case, the passivation layer 405 can be formed by first depositing a silicon-oxide layer with a thickness of between 0.5 and 3.0 microns using a HDP-CVD process, then depositing a silicon-nitride layer with a thickness of between 0.2 and 1.0 microns on the silicon-oxide layer using a PECVD process, and then depositing another silicon-oxide layer with a thickness of between 0.5 and 3.0 microns on the silicon-nitride layer using a HDP-CVD process.

Referring to FIG. 4A, a patterned metal layer 406 working as a redistribution layer (RDL) is deposited on the passivation layer 405 and connected to the contact pads 402 through the openings 480 in the passivation layer 405. The redistribution layer 406 includes multiple contact pads 481 and 482 used to have metal bumps 407 formed thereon or used to be wirebonded thereto. The contact pads 481 and 482 have positions different from those of the contact pads 402 exposed by the openings 480 in the passivation layer 405 from a top view, as shown in FIG. 4. FIG. 4 is a top view of FIGS. 4A-4N. The contact pads 481 and 482 are placed close to the edge 490 of the semiconductor chip 400. The contact pads 481 are aligned in an external line, while the contact pads 482 are aligned in an internal line. Multiple traces 484 of the patterned metal layer 406 connecting the contact pads 402 exposed by the openings 480 in the passivation layer 405 to the contact pads 482 aligned in the internal line pass through the gap between the neighboring contact pads 481 aligned in the external line. Multiple traces 483 of the patterned metal layer 406 connect the contact pads 402 exposed by the openings 480 in the passivation layer 405 to the contact pads 481 aligned in the internal line.

Referring to FIG. 4A, the metal bumps 407 are formed over the semiconductor devices 403 and thin-film metal layers 404. The metal bumps 407 can be connected to electrical contact pads on a glass substrate, flexible substrate, TAB (tape automated bonding) carrier or printed circuit board. The metal bumps 407 are formed with more than 50 percent by weight of, and preferably with more than 90 percent by weight of, gold, copper, nickel, platinum, palladium, ruthenium or rhodium, for example. The metal bumps 407 have a height h1 of between 8 and 50 microns, and preferably between 10 and 30 microns. The contact pads 402 are formed over an ESD (electrostatic discharge) circuit 403a and connected to the ESD circuit 403a through a metal plug 410. The metal plug 410 has a bottom end joined to a contact of the ESD circuit 403a and a top end joined to the bottom of the contact pads 402.

Figure 4B:
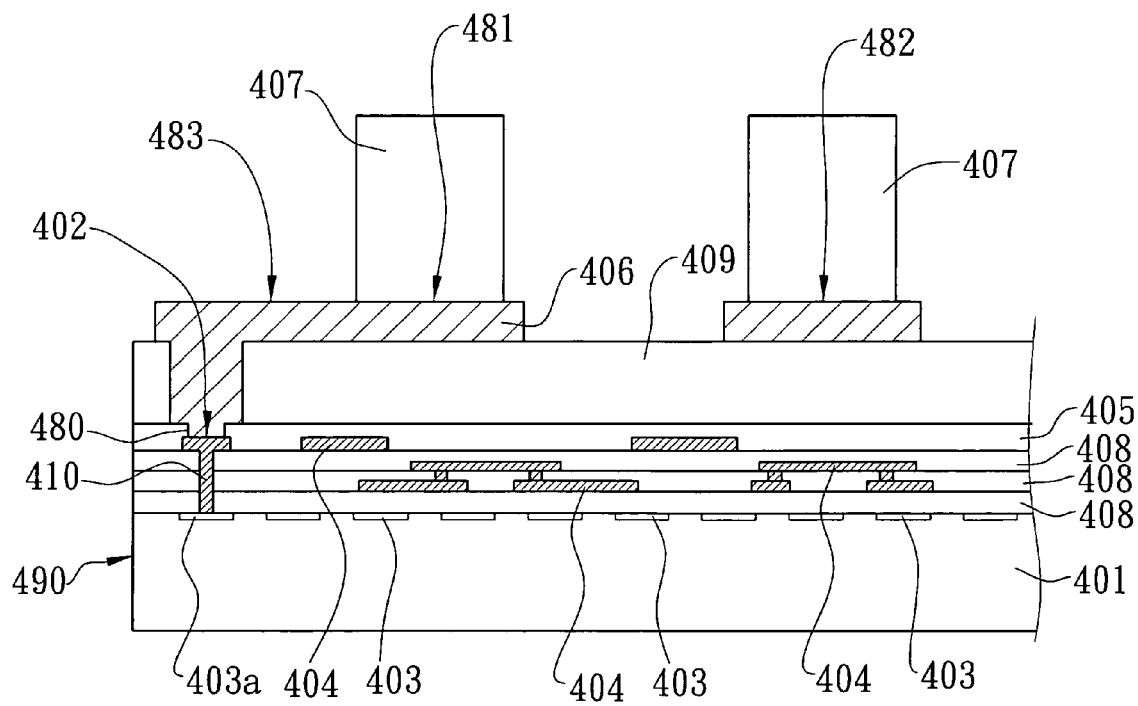
FIGS. 4B-4N illustrate cross-sectional views of alternative semiconductor chips according to the invention.

Referring to FIG. 4B, another embodiment of the invention, it is almost similar to the detail in FIG. 4A except there is a polymer layer 409 formed on the passivation layer 405 and under the patterned metal layer 406. The polymer layer 409 may be polyimide, benzocyclobutene (BCB), silicone, Teflon, paralene or rubber. Alternatively, the polymer layer 409 may be a porous structure. The polymer layer 409 may have a thickness t1 of between 1 and 30 microns, and, preferably, between 3 and 10 microns.

Figure 4C:
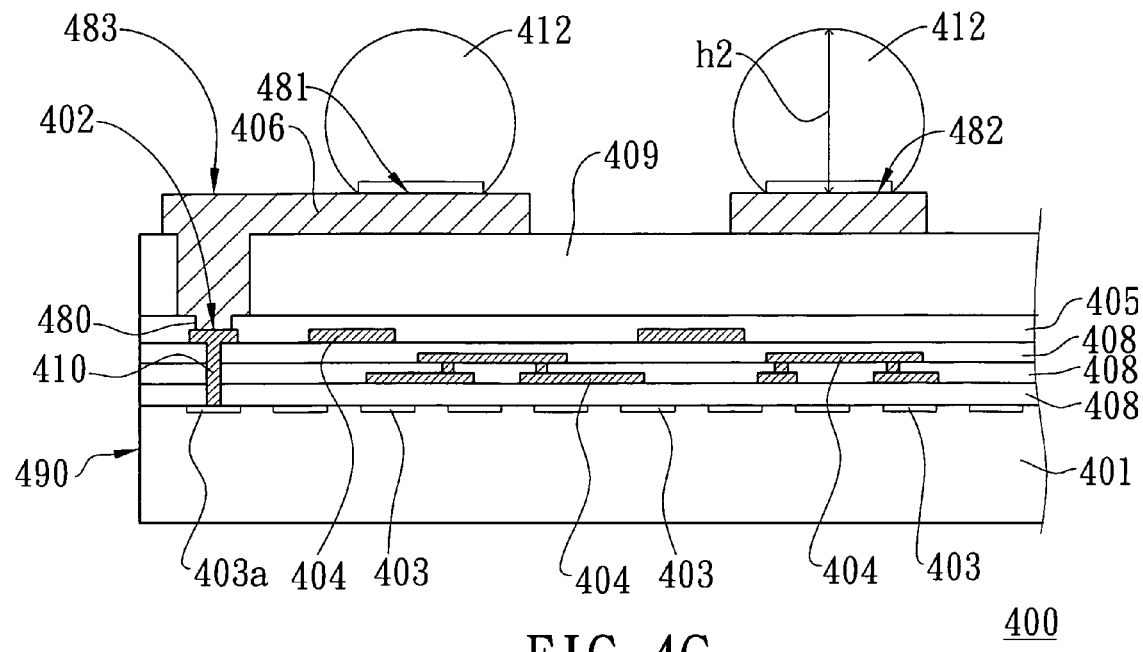

Referring to FIG. 4C, another embodiment of the invention, it is almost similar to the detail in FIGS. 4A and 4B except the following description. The contact pads 481 and 482 of the patterned metal layer 406 aligned in the external and internal lines are used to be joined with solder bumps 412 formed principally of tin-lead alloy, tin-silver alloy or tin-silver-copper alloy, for example, and have a height h2 of between 25 and 500 microns. The metal bumps 412 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4D:
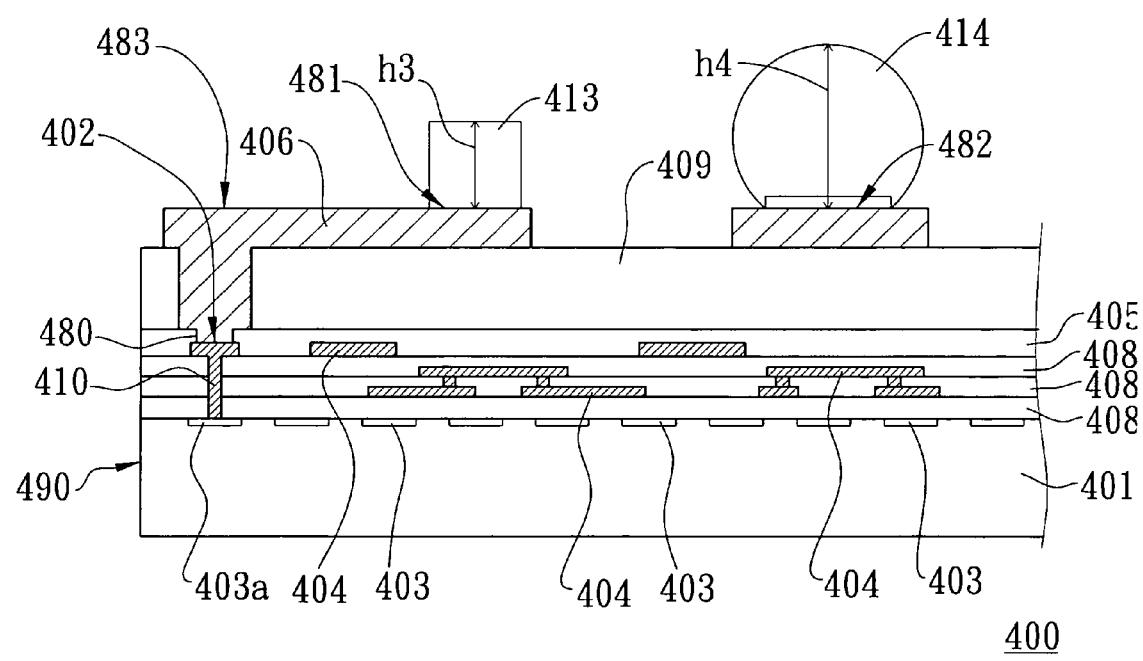

Referring to FIG. 4D, another embodiment of the invention, it is almost similar to the detail in FIGS. 4A and 4B except the following description. The contact pads 481 of the patterned metal layer 406 aligned in the external line are used to be joined with multiple metal bumps 413 formed with more than 50 percent by weight of, and preferably with more than 90 percent by weight of, gold, copper, nickel, platinum, palladium, ruthenium or rhodium, for example. The metal bumps 413 have a height h3 of between 8 and 50 microns, and preferably between 10 and 30 microns. The metal bumps 413 are used to be joined with an electrical contact formed on a glass substrate, flexible substrate, TAB carrier, printed circuit board or another semiconductor chip. The contact pads 482 of the patterned metal layer 406 aligned in the internal line are used to be joined with multiple metal bumps 414 formed principally of tin-lead alloy, tin-silver alloy or tin-silver-copper alloy, for example, and having a height h4 of between 25 and 500 microns. The metal bumps 414 are used to be joined with electrical contact pads formed on a glass substrate, flexible substrate, TAB carrier, printed circuit board or another semiconductor chip. The metal bumps 414 aligned in the internal liner are higher than the metal bumps 413 aligned in the external line, for example. Optionally, the patterned metal layer 406 can be formed on the passivation layer 405 without the polymer layer 409 between the patterned metal layer 406 and the passivation layer 405.

Figure 4E:
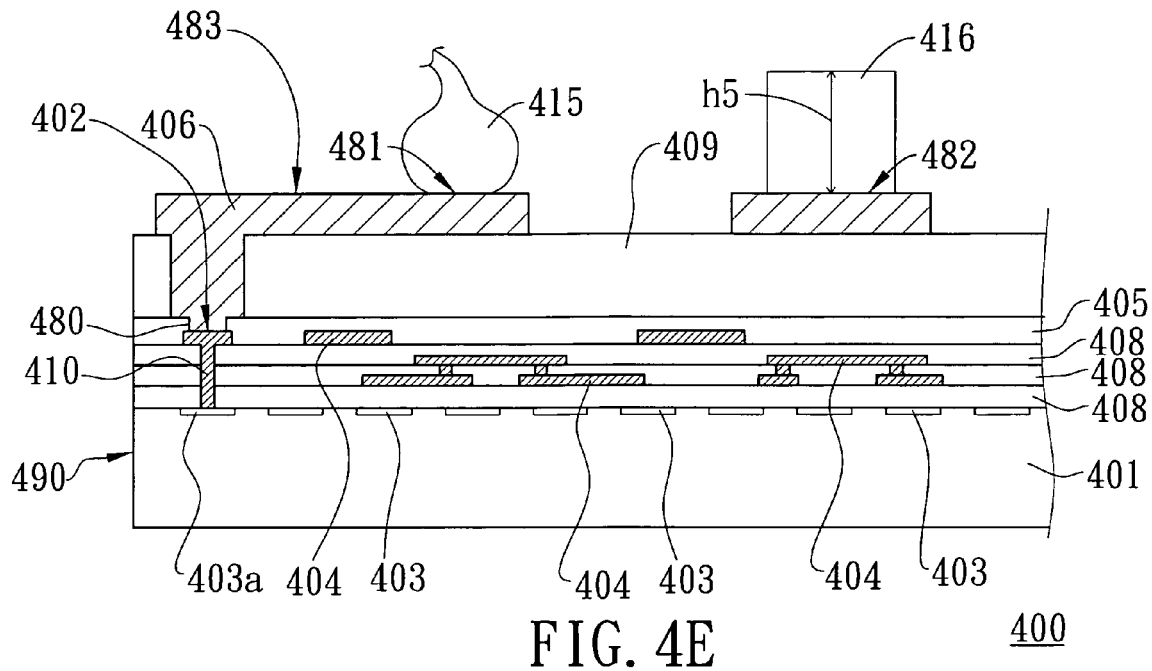

Referring to FIG. 4E, another embodiment of the invention, it is almost similar to the detail in FIGS. 4A and 4B except the following description. The contact pads 481 of the patterned metal layer 406 aligned in the external line are used to be joined with wires 415 formed by a wirebonding process. The contact pads 482 of the patterned metal layer 406 aligned in the internal line are used to be joined with multiple metal bumps 416 formed with more than 50 percent by weight of, and preferably with more than 90 percent by weight of, gold, copper, nickel, platinum, palladium, ruthenium or rhodium, for example. The metal bumps 416 have a height h5 of between 8 and 50 microns, and preferably between 10 and 30 microns. The metal bumps 416 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4F:
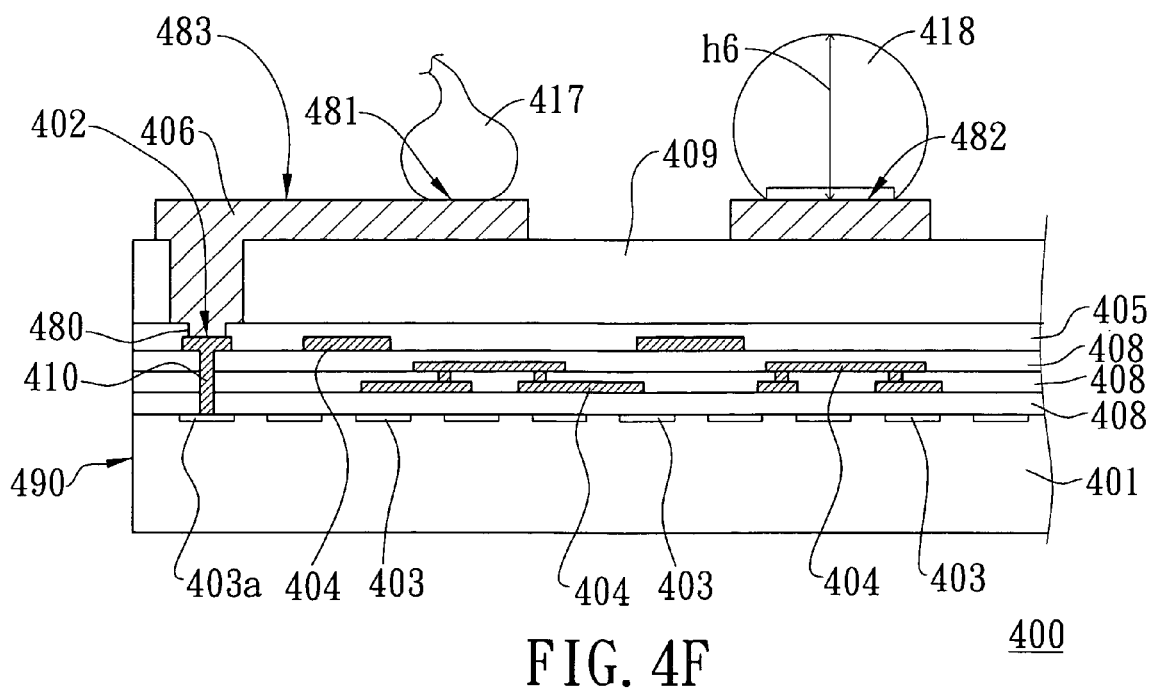

Referring to FIG. 4F, another embodiment of the invention, it is almost similar to the detail in FIGS. 4A and 4B except the following description. The contact pads 481 of the patterned metal layer 406 aligned in the external line are used to be joined with wires 417 formed by a wirebonding process. The contact pads 482 of the patterned metal layer 406 aligned in the internal line are used to be joined with multiple metal bumps 418 formed principally of tin-lead alloy, tin-silver alloy or tin-silver-copper alloy, for example, and having a height h6 of between 25 and 500 microns. The metal bumps 418 are used to be joined with multiple electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4G:
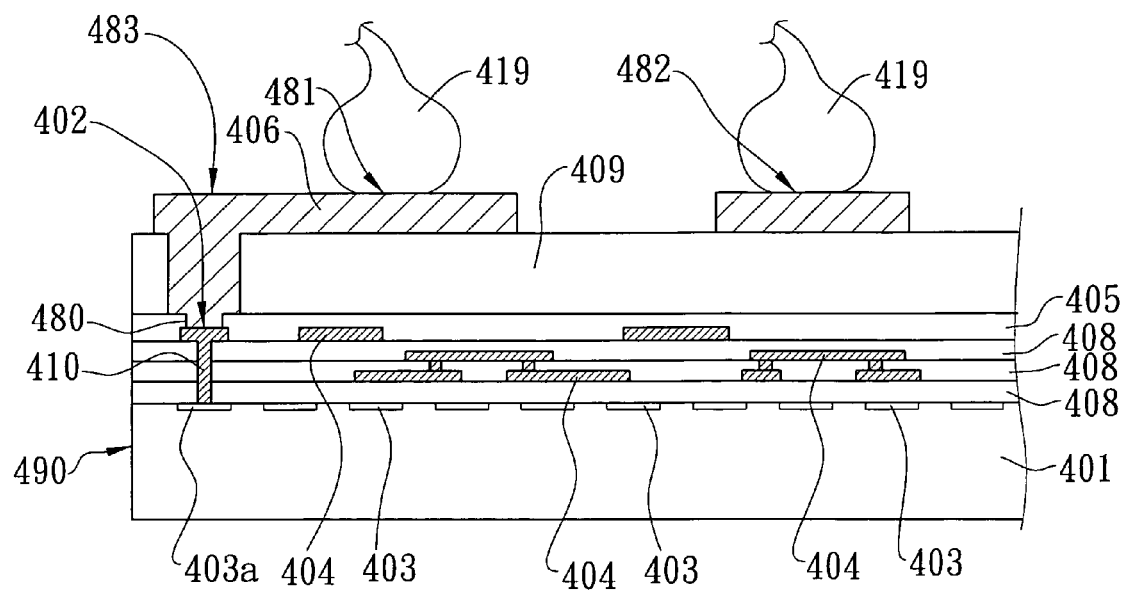

Referring to FIG. 4G, another embodiment of the invention, it is almost similar to the detail in FIGS. 4A and 4B except the following description. The contact pads 481 and 482 of the patterned metal layer 406 aligned in the external and internal lines are used to be joined with wires 419 formed by a wirebonding process. Optionally, the patterned metal layer 406 can be formed on the passivation layer 405 without the polymer layer 409 between the patterned metal layer 406 and the passivation layer 405.

Figure 4H:
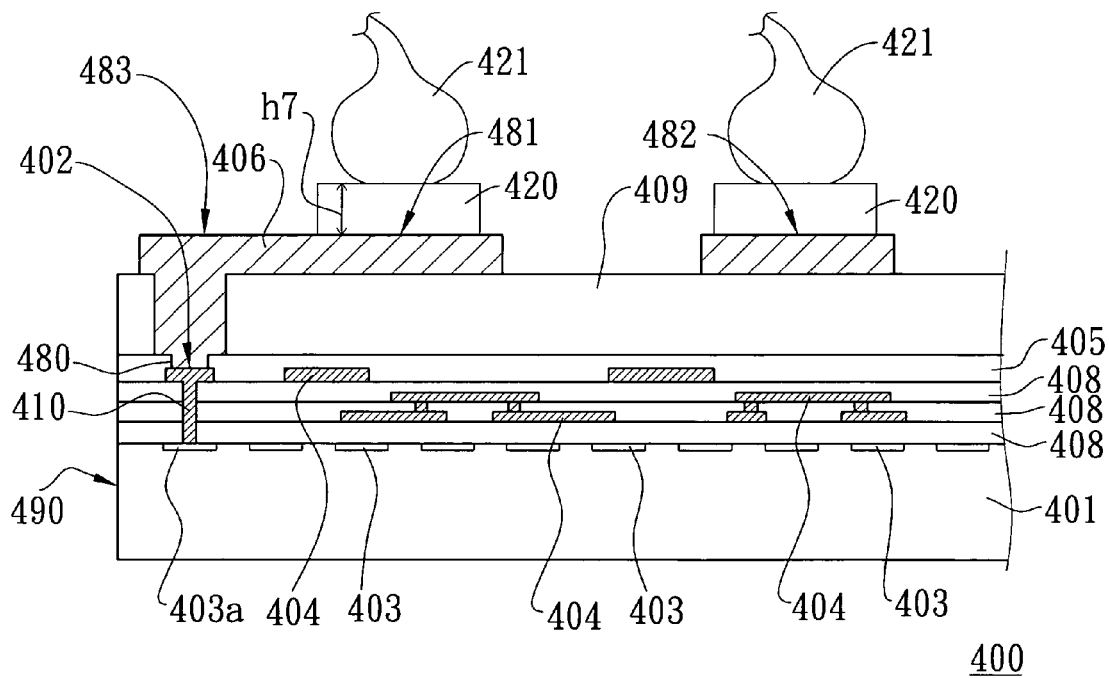

Referring to FIG. 4H, another embodiment of the invention, it is almost similar to the detail in FIGS. 4A and 4B except the following description. Metal bumps 420 are formed with more than 50 percent by weight of, and preferably with more than 90 percent by weight of, gold, copper, nickel, platinum, palladium, ruthenium or rhodium, for example. The metal bumps 420 have a height h7 of between 1 and 20 microns, and preferably between 1 and 10 microns. The metal bumps 420 are deposited on the contact pads 481 and 482 of the patterned metal layer 406 aligned in the external and internal lines. The metal bumps 420 are used to be joined with wires 421 formed by a wirebonding process. Optionally, the patterned metal layer 406 can be formed on the passivation layer 405 without the polymer layer 409 between the patterned metal layer 406 and the passivation layer 405.

Figure 4I:
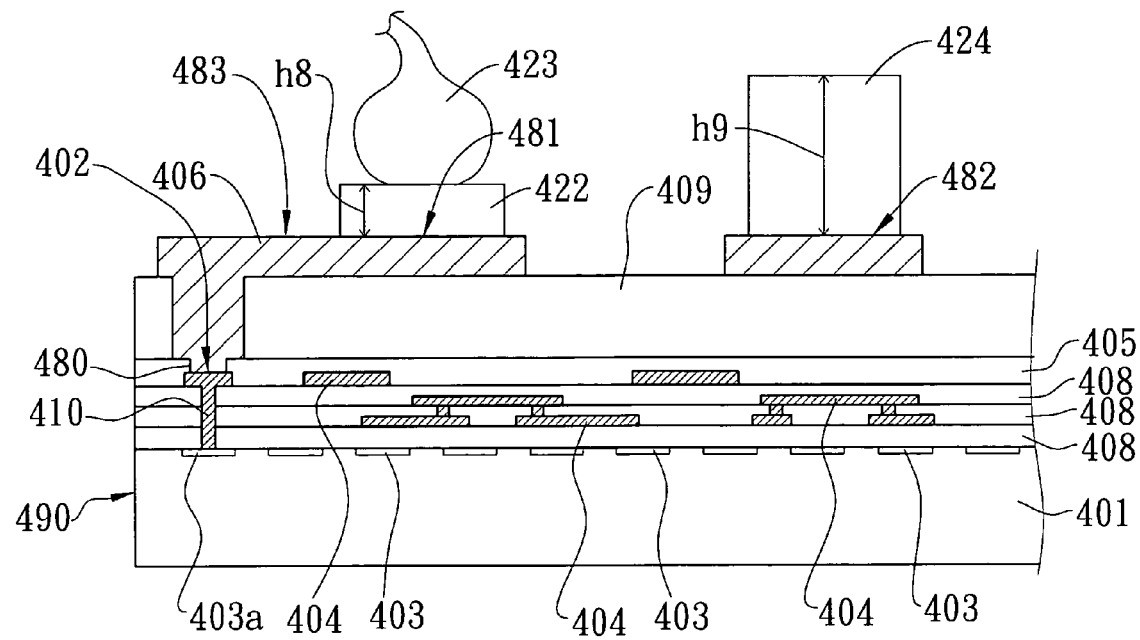

Referring to FIG. 4I, another embodiment of the invention, it is almost similar to the detail in FIGS. 4A and 4B except the following description. Metal bumps 422 are formed with more than 50 percent by weight of, and preferably with more than 90 percent by weight of, gold, copper, nickel, platinum, palladium, ruthenium or rhodium, for example. The metal bumps 422 have a height h8 of between 1 and 20 microns, and preferably between 1 and 10 microns. The metal bumps 422 are deposited on the contact pads 481 of the patterned metal layer 406 aligned in the external line. The metal bumps 422 are used to be joined with wires 423 formed by a wirebonding process. Metal bumps 424 are formed with more than 50 percent by weight of, and preferably with more than 90 percent by weight of, gold, copper, nickel, platinum, palladium, ruthenium or rhodium, for example. The metal bumps 424 have a thickness h9 of between 8 and 50 microns, and preferably between 10 and 30 microns. The metal bumps 424 are deposited on the contact pads 482 of the patterned metal layer 406 aligned in the internal line. The metal bumps 424 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4J:
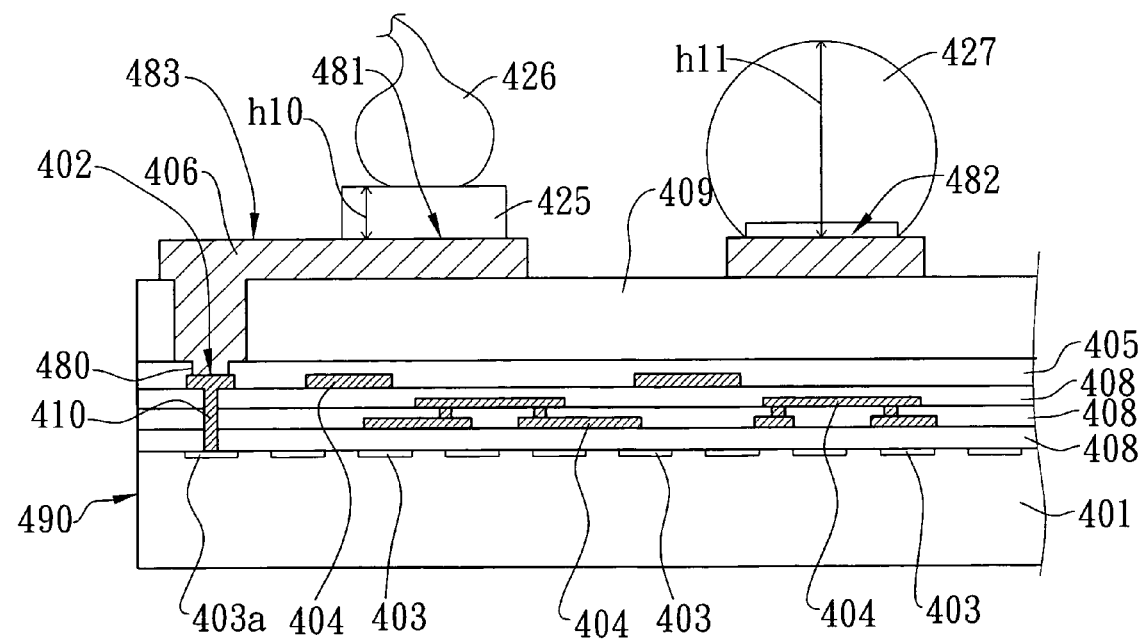

Referring to FIG. 4J, another embodiment of the invention, it is almost similar to the detail in FIGS. 4A and 4B except the following description. Metal bumps 425 are formed with more than 50 percent by weight of, and preferably with more than 90 percent by weight of, gold, copper, nickel, platinum, palladium, ruthenium or rhodium, for example. The metal bumps 425 have a height h10 of between 1 and 20 microns, and preferably between 1 and 10 microns. The metal bumps 425 are deposited on the contact pads 481 of the patterned metal layer 406 aligned in the external line. The metal bumps 425 are used to be joined with wires 426 formed by a wirebonding process. Metal bumps 427 formed principally of tin-lead alloy, tin-silver alloy or tin-silver-copper alloy, for example, and having a thickness h11 of between 25 and 500 microns are deposited on the contact pads 482 of the patterned metal layer 406 aligned in the internal line. The metal bumps 427 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4K:
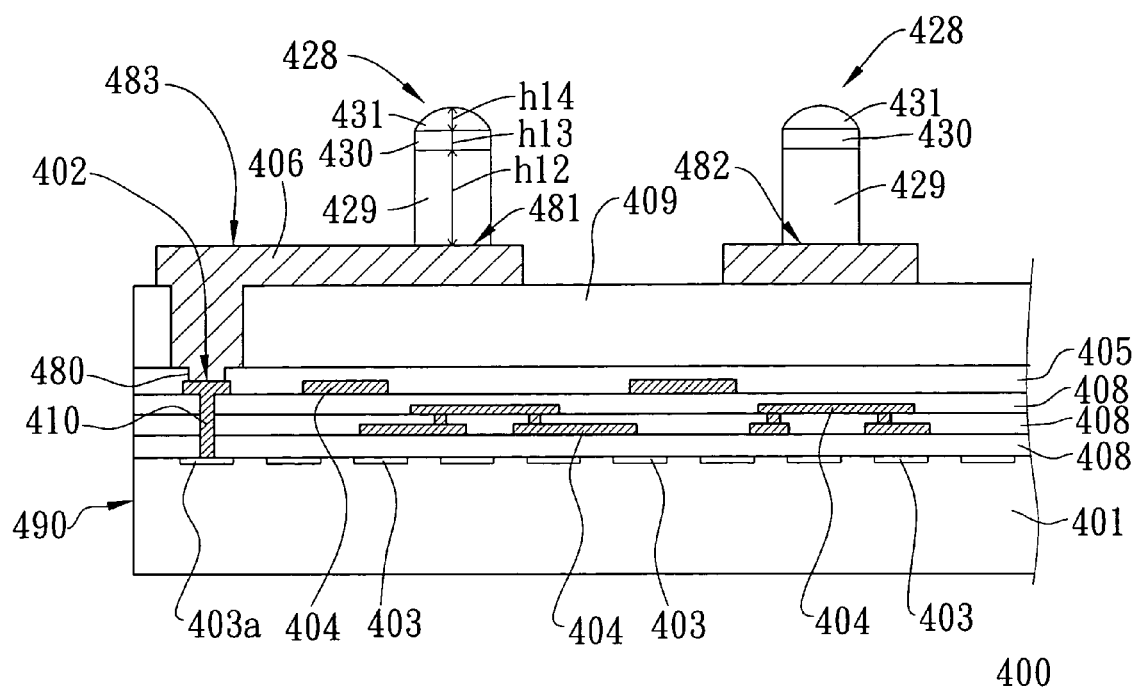

Referring to FIG. 4K, another embodiment of the invention, it is almost similar to the detail in FIGS. 4A and 4B except the following description. Metal bumps 428 each including a metal post 429, a diffusion-barrier layer 430 on the metal post 429, and a solder cap 431 on the diffusion-barrier layer 430 are deposited on the contact pads 481 and 482 of the patterned metal layer 406 aligned in the external and internal lines. The metal post 429 is formed with more than 50 percent by weight of, and preferably with more than 90 percent by weight of, gold, copper, nickel, platinum, palladium, ruthenium or rhodium, for example, and has a height h12 of between 5 and 250 microns, and preferably between 50 and 100 microns. The diffusion-barrier layer 430 is formed with more than 50 percent by weight of, and preferably with more than 90 percent by weight of, nickel, for example, and has a height h13 of between 0.5 and 10 microns. The metal cap 431 is formed principally of tin-lead alloy, tin-silver-copper alloy or tin-silver alloy, for example, and has a height h14 of between 10 and 200 microns. The metal bumps 428 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4L:
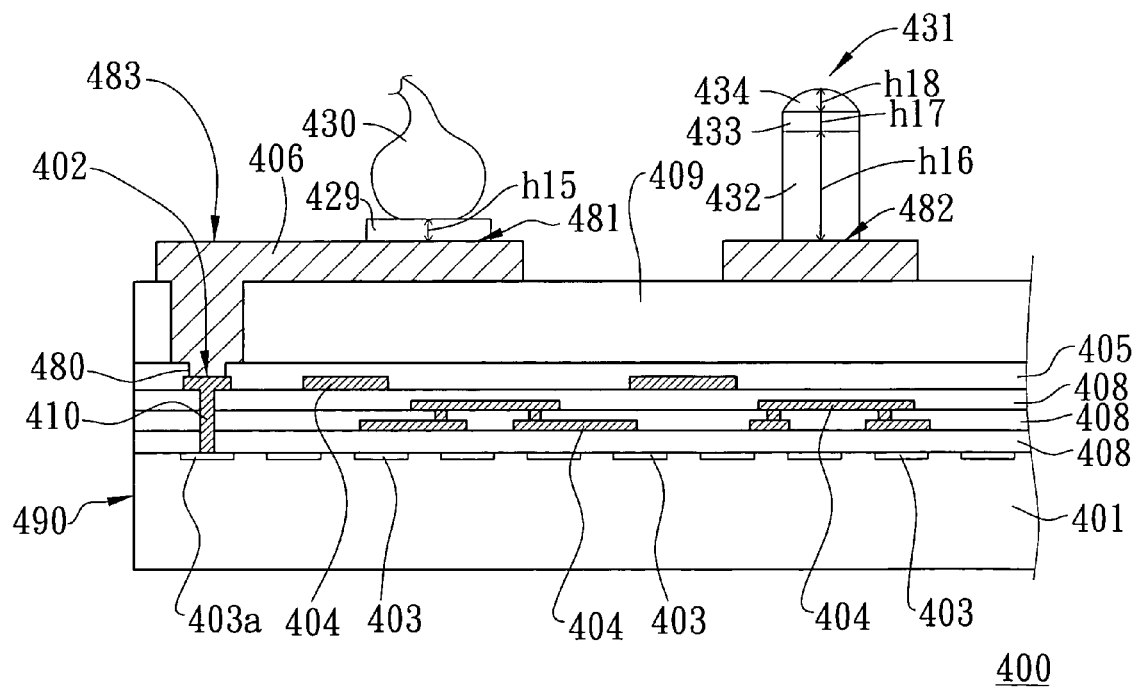

Referring to FIG. 4L, another embodiment of the invention, it is almost similar to the detail in FIGS. 4A and 4B except the following description. Metal bumps 429 are formed with more than 50 percent by weight of, and preferably with more than 90 percent by weight of, gold, copper, nickel, platinum, palladium, ruthenium or rhodium, for example. The metal bumps 429 have a height h15 of between 1 and 20 microns, and preferably between 1 and 10 microns. The metal bumps 429 are deposited on the contact pads 481 of the patterned metal layer 406 aligned in the external line. The metal bumps 429 are used to be joined with wires 430 formed by a wirebonding process. Metal bumps 431 each including a metal post 432, a diffusion-barrier layer 433 on the metal post 432, and a solder cap 434 on the diffusion-barrier layer 433 are deposited on the contact pads 482 of the patterned metal layer 406 aligned in the internal line. The metal post 432 is formed with more than 50 percent by weight of, and preferably with more than 90 percent by weight of, gold, copper, nickel, platinum, palladium, ruthenium or rhodium, for example, and has a height h16 of between 5 and 250 microns, preferably between 50 and 100 microns. The diffusion-barrier layer 433 is formed with more than 50 percent by weight of, and preferably with more than 90 percent by weight of, nickel, for example, and has a height h17 of between 0.5 and 10 microns. The metal cap 434 is formed principally of tin-lead alloy, tin-silver-copper alloy or tin-silver alloy, for example, and has a height h18 of between 10 and 200 microns. The metal bumps 431 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4M:
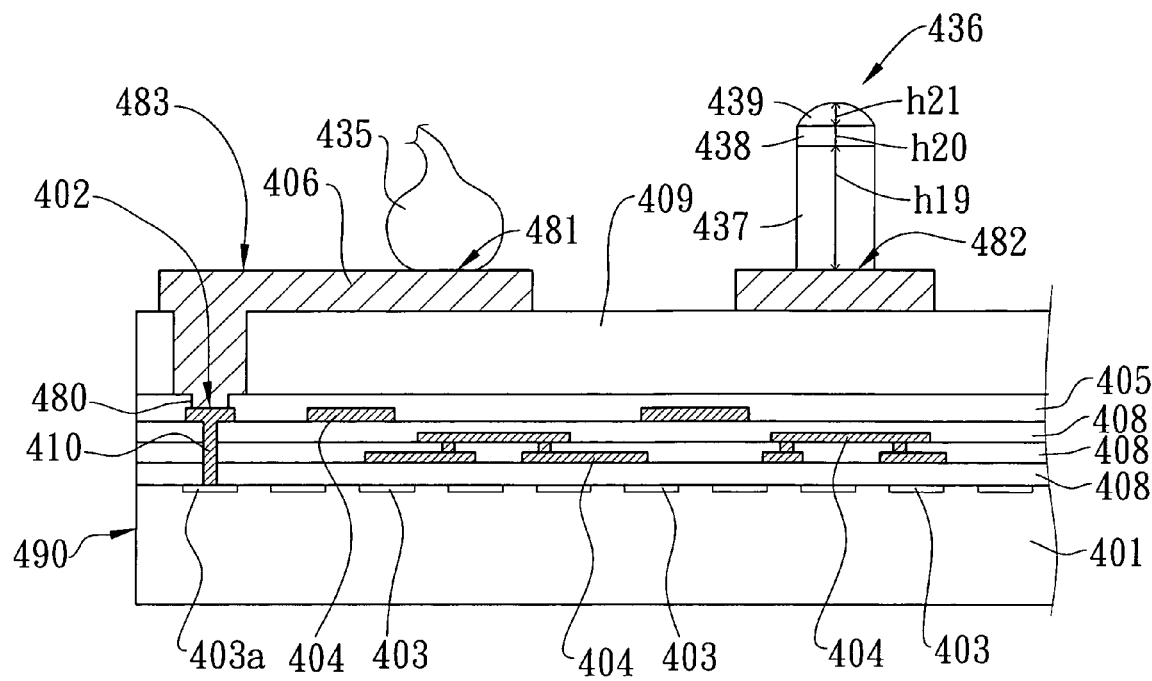

Referring to FIG. 4M, another embodiment of the invention, it is almost similar to the detail in FIGS. 4A and 4B except the following description. The contact pads 481 of the patterned metal layer 406 aligned in the external line are used to be joined with wires 435 formed by a wirebonding process. Metal bumps 436 each including a metal post 437, a diffusion-barrier layer 438 on the metal post 437, and a solder cap 439 on the diffusion-barrier layer 438 are deposited on the contact pads 482 of the patterned metal layer 406 aligned in the internal lines. The metal post 437 is formed with more than 50 percent by weight of, and preferably with more than 90 percent by weight of, gold, copper, nickel, platinum, palladium, ruthenium or rhodium, for example, and has a height h19 of between 5 and 250 microns, preferably between 50 and 100 microns. The diffusion-barrier layer 438 is formed with more than 50 percent by weight of, and preferably with more than 90 percent by weight of, nickel, for example, and has a height h20 of between 0.5 and 10 microns. The metal cap 439 is formed principally of tin-lead alloy, tin-silver-copper alloy or tin-silver alloy, for example, and has a height h21 of between 10 and 200 microns. The metal bumps 436 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4N:
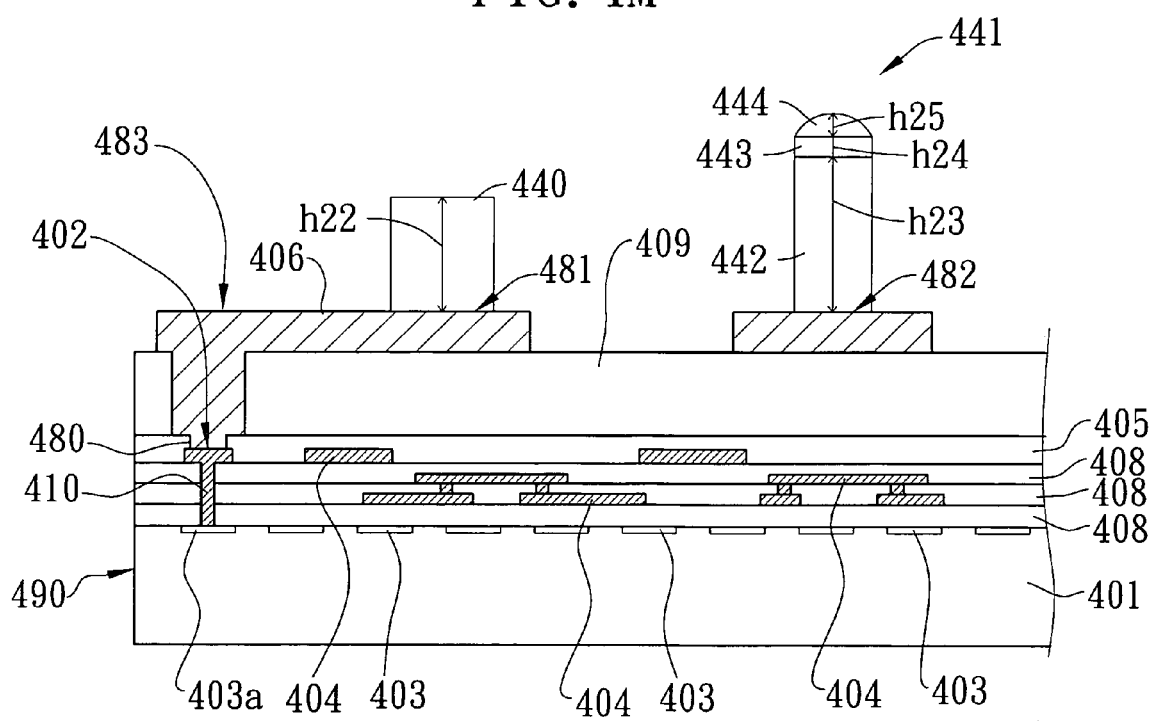

Referring to FIG. 4N, another embodiment of the invention, it is almost similar to the detail in FIGS. 4A and 4B except the following description. Metal bumps 440 are formed with more than 50 percent by weight of, and preferably with more than 90 percent by weight of, gold, copper, nickel, platinum, palladium, ruthenium or rhodium, for example. The metal bumps 440 have a height h22 of between 8 and 50 microns, and preferably between 10 and 30 microns. The metal bumps 440 are deposited on the contact pads 481 of the patterned metal layer 406 aligned in the external line. The metal bumps 440 are used to be joined with electrical contact pads formed on a glass substrate, flexible substrate, TAB carrier, printed circuit board or another semiconductor chip. Metal bumps 441 each including a metal post 442, a diffusion-barrier layer 443 on the metal post 442, and a solder cap 444 on the diffusion-barrier layer 443 are deposited on the contact pads 482 of the patterned metal layer 406 aligned in the internal line. The metal post 442 is formed with more than 50 percent by weight of, and preferably with more than 90 percent by weight of, gold, copper, nickel, platinum, palladium, ruthenium or rhodium, for example, and has a height h23 of between 5 and 250 microns, preferably between 50 and 100 microns. The diffusion-barrier layer 443 is formed with more than 50 percent by weight of, and preferably with more than 90 percent by weight of, nickel, for example, and has a height h24 of between 0.5 and 10 microns. The metal cap 444 is formed principally of tin-lead alloy, tin-silver-copper alloy or tin-silver alloy, for example, and has a height h25 of between 10 and 200 microns. The metal bumps 441 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 5A:
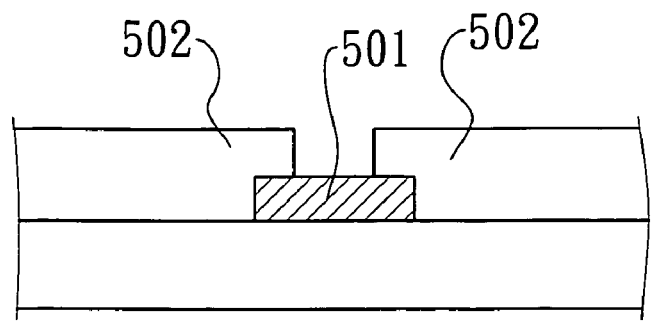
FIGS. 5A-5F illustrate cross-sectional views of forming an RDL layer and metal bump according to the invention.

FIGS. 5A-5F illustrate a process for forming the above-mentioned RDL layer and metal bumps in accordance with the invention. Referring to FIG. 5A, a semiconductor wafer 500 includes a semiconductor substrate, multiple thin-film dielectric layers, multiple thin-film metal layers and a passivation layer 502, whose detail structures can be as referred to the embodiment shown in FIG. 4A. The topmost one of the thin-film metal layers includes a contact pad 501 exposed by an opening in the passivation layer 502. In another embodiment, there can be a polymer layer (not shown) formed to improve the planerization and buffer the stress, which can be as referred to FIG. 4b. The polymer layer, such as polyimide, is on the passivation layer 502, and an opening in the polymer exposes the contact pad 501. The preferred thickness of the polymer ranges from 1 μm to 30 μm.

Figure 5B:
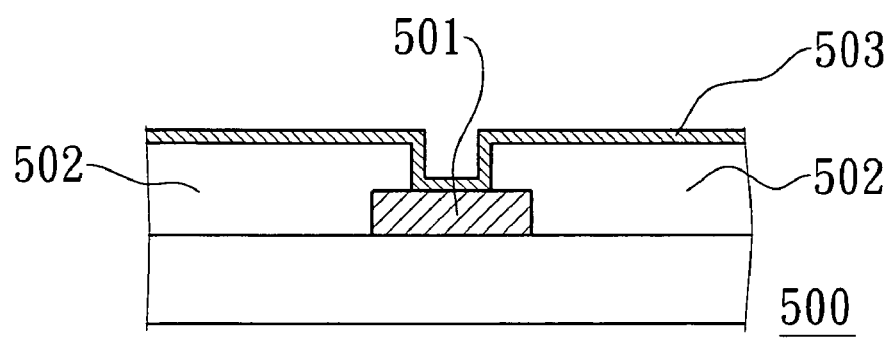

Next, referring to FIG. 5B, an adhesion/barrier layer 503 is formed, such as by sputtering or evaporating, to cover the contact pad 501 and the passivation layer. The material for adhesion/barrier layer 503 may be Ti, Cr, or TiW. Then a seed layer (not shown) is formed on the adhesion/barrier layer 503. Sputtering, electroplating, or electroless plating may be employed to form the seed layer.

Figure 5C:
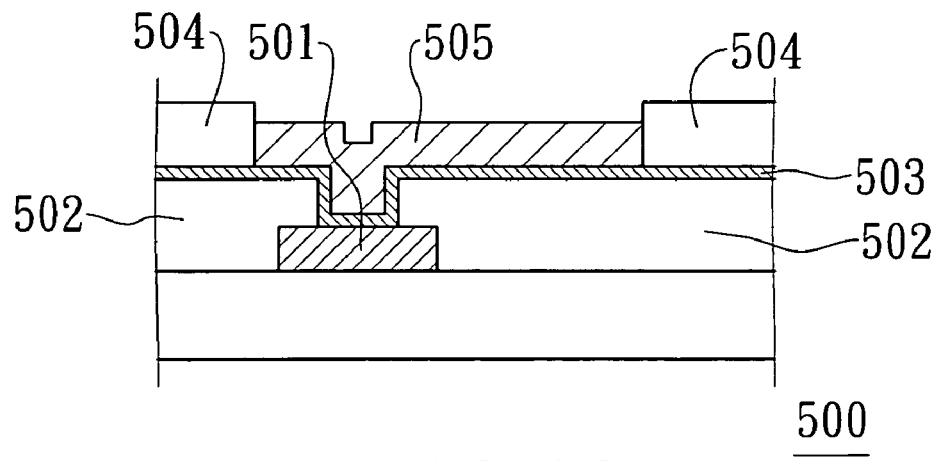

Then referring to FIG. 5C, forming a photoresist (PR) layer 504 is employed to define the pattern of the RDL layer 505. The photoresist (PR) layer 504 may have a thickness of between 1 microns and 50 microns, and preferably between 3 microns and 15 microns. A layer 505 of Au or Cu having a thickness of between 1 and 10 microns is preferred to fill the openings in the PR layer 504 using an electroplating or electroless plating process. If a layer of Cu is employed, optionally, another layer of Ni may be electroplated or electroless plated on the Cu layer to prevent the Cu layer from oxidizing.

Figure 5D:
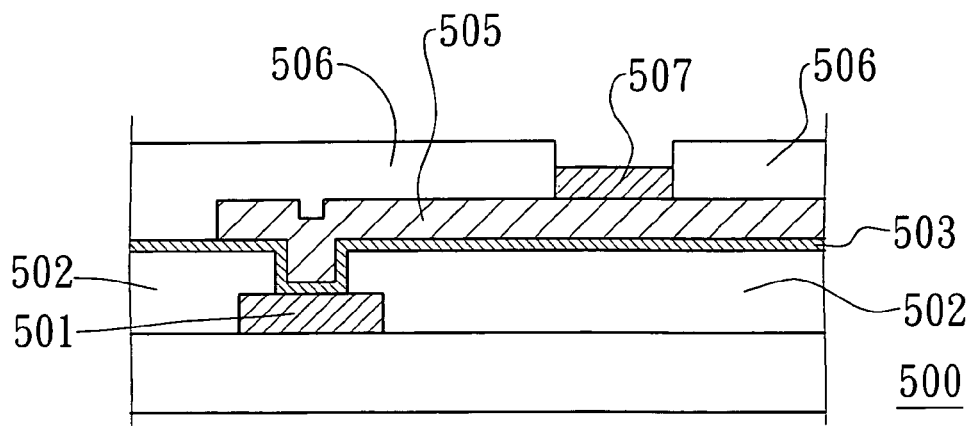

Now referring to FIG. 5D, the PR layer 504 is removed, and then another PR layer 506 is deposited on the metal layer 505, an opening in the PR layer 506 exposing the underlying metal layer 505. Next, one or more metal layers composing a metal bump are deposited on the underlying metal layer 505 exposed by the opening in the PR layer 506 using an electroplating or electroless plating process.

In an embodiment for forming a metal bump, an adhesion/barrier layer, such as copper, nickel, gold, titanium, chromium or titanium-tungsten alloy, can be optionally formed on the metal layer 505 exposed by the opening in the PR layer 506 using an electroplating or electroless-plating process. Next, a metal layer having more than 95 percent by weight of gold, copper, nickel, platinum, palladium, ruthenium or rhodium, for example, and having a height of between 1 and 50 microns is formed optionally on the adhesion/barrier layer or on the metal layer 505 exposed by the opening in the PR layer 506 using an electroplating or electroless-plating process. The metal bump can be used to be wirebonded thereto or to be connected to an electrical contact formed on a glass substrate, flexible substrate, TAB carrier, printed circuit board or another semiconductor chip.

In another embodiment for forming a metal bump, an adhesion/barrier layer, such as copper, nickel, gold, titanium, chromium or titanium-tungsten alloy, can be optionally formed on the metal layer 505 exposed by the opening in the PR layer 506 using an electroplating or electroless-plating process. Preferably, the adhesion/barrier layer is formed by depositing a copper layer with more than 95 percent by weight of copper on the metal layer 505 using an electroplating or electroless-plating process, and then depositing a nickel layer with more than 95 percent by weight of nickel on the copper layer using an electroplating or electroless-plating process. Next, a solder layer, such as tin-lead alloy, tin-silver alloy or tin-silver-copper alloy, having a thickness of between 25 and 500 microns is formed optionally on the adhesion/barrier layer, and preferably on the nickel layer of the adhesion/barrier layer, or on the metal layer 505 using an electroplating or electroless-plating process. The metal bump can be used to be connected to an electrical contact formed on a glass substrate, flexible substrate, TAB carrier, printed circuit board or another semiconductor chip.

In another embodiment for forming a metal bump, an adhesion/barrier layer, such as copper, nickel, gold, titanium, chromium or titanium-tungsten alloy, can be optionally formed on the metal layer 505 exposed by the opening in the PR layer 506 using an electroplating or electroless-plating process. Next, for forming a metal post, a layer of gold, copper, nickel, platinum, palladium, ruthenium or rhodium, for example, having a height of between 5 and 250 microns, and preferably between 50 and 100 microns, is formed optionally on the adhesion/barrier layer or on the metal layer 505 exposed by the opening in the PR layer 506 using an electroplating or electroless-plating process. Preferably, the metal post is formed principally of copper, that is, the metal post has more than 95 percent by weight of copper. Next, for forming a diffusion-barrier layer, a nickel layer having more than 95 percent by weight of nickel and having a height of between 0.5 and 10 microns is formed on the metal post using an electroplating or electroless-plating process. Next, for forming a solder cap, a solder layer, such as tin-lead alloy, tin-silver alloy, or tin-silver-copper alloy, having a height of between 10 and 200 microns is formed on the diffusion-barrier layer using an electroplating or electroless-plating process. The metal bump can be used to be connected to an electrical contact formed on a glass substrate, flexible substrate, TAB carrier, printed circuit board or another semiconductor chip.

Figure 5E:
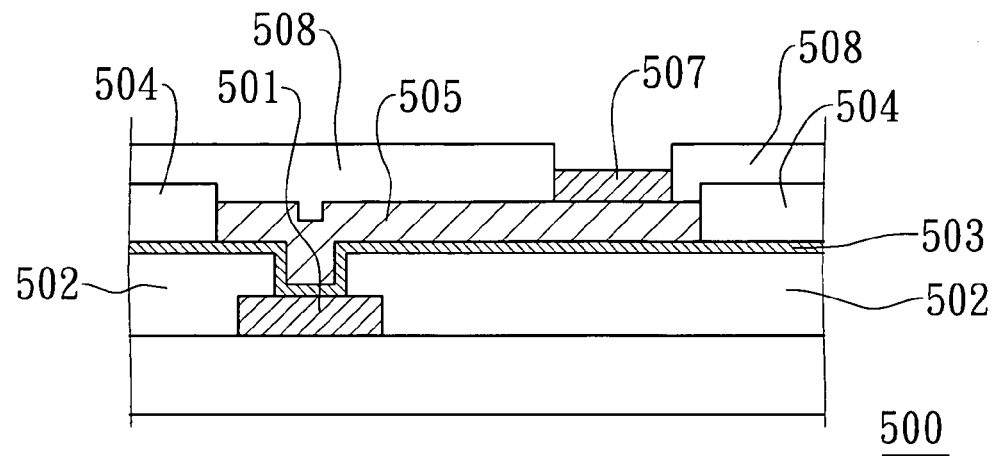
Figure 5F:
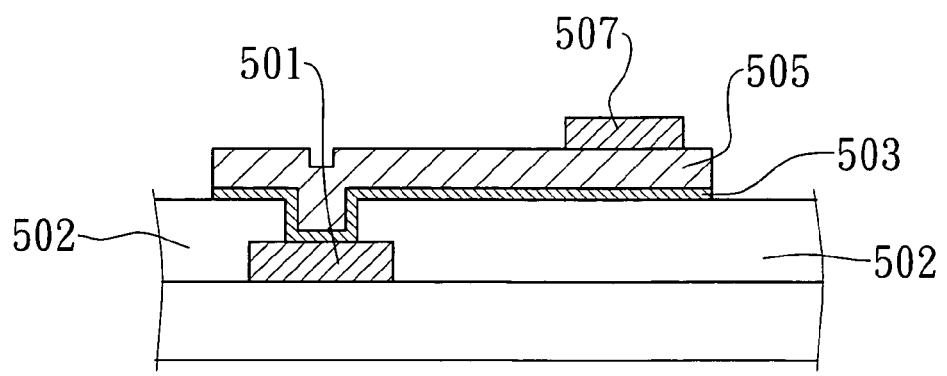

Referring to FIG. 5F, after forming the metal bump 507, the PR layer 506 is removed. Thereafter, the seed layer and the adhesion/barrier layer 503 not under the metal layer 505 are removed using an etching process. Next, if the metal bumps comprise solder, a reflow process is performed.

FIG. 5E illustrates the alternate way to form the above-mentioned patterned metal layer and metal bump. The difference between FIG. 5E and FIG. 5D is that the PR layer 504 for defining the pattern of the metal layer 505 is not removed. The later-formed PR layer 508 is formed on the PR layer 504 and the RDL layer 505. An opening in the PR layer 508 exposes the RDL layer 505 for defining the pattern of the later-formed metal bump 507. The process for depositing the metal bump 507 can be as referred to the above disclosure. Finally, referring to FIG. 5F, the PR layers 508 and 504 are removed. Thereafter, the seed layer and adhesion/barrier layer not under the metal layer 505 are removed using an etching process. Next, if the metal bumps comprise solder, a reflow process is performed.

Figure 6:
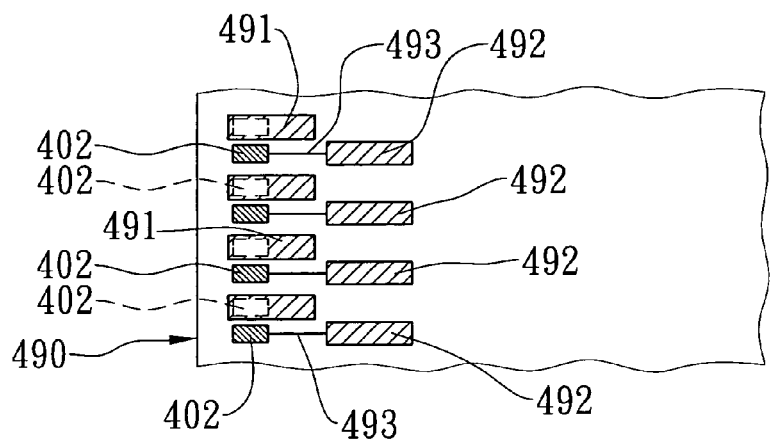
FIGS. 6-6A illustrate top and cross-sectional views of an alternative semiconductor chip according to the invention.
Figure 6A:
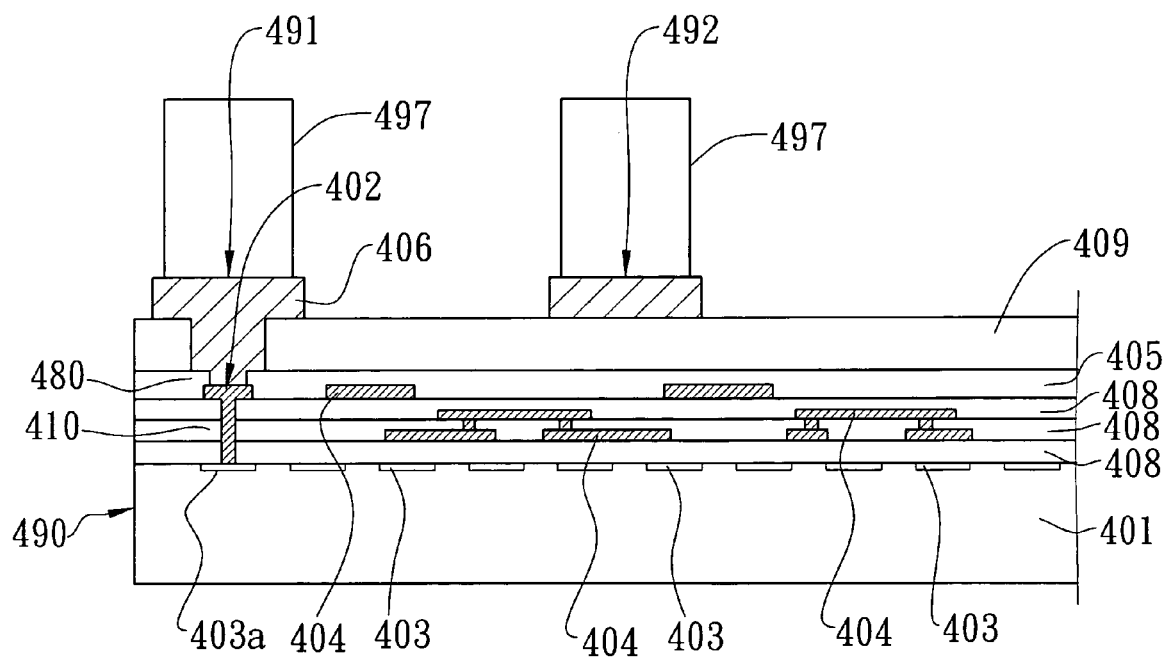

FIGS. 6 and 6A are an embodiment of the invention to show top and cross-sectional views of a semiconductor chip. The contact pads 402 are placed close to the edge 490 of the semiconductor chip 400. A patterned metal layer 406 including multiple contact pads 491 and 492 and traces 493 is formed on the polymer layer 409 and on the contact pads 402 exposed by openings in the passivation layer 405. The contact pads 491 aligned in the external line are placed on the contact pads 402 exposed by the openings in the passivation layer 405, while the contact pads 492 aligned in the internal line are placed not on the contact pads 402 exposed by the openings in the passivation layer 405 but on the polymer layer 409. The traces 493 of the patterned metal layer connect the contact pads 402 exposed by the openings in the passivation layer 405 to the contact pads 492 aligned in the internal line. Various metal bumps described in the above paragraphs can be formed on the contact pads 491 and 492. Wires formed by a wirebonding process can also be connected to the contact pads 491 and 492. The combinations for depositing the above-mentioned various metal bumps or wires formed by a wirebonding process on the contact pads 491 and 492 aligned in the external or internal lines can be as referred to FIGS. 4A-4N. The process for forming the patterned metal layer 406 and the metal bumps 497 can be as referred to FIGS. 5A-5F. Optionally, the patterned metal layer 406 can be formed on the passivation layer 405 without the polymer layer 409 between the patterned metal layer 406 and the passivation layer 405.

Figure 7:
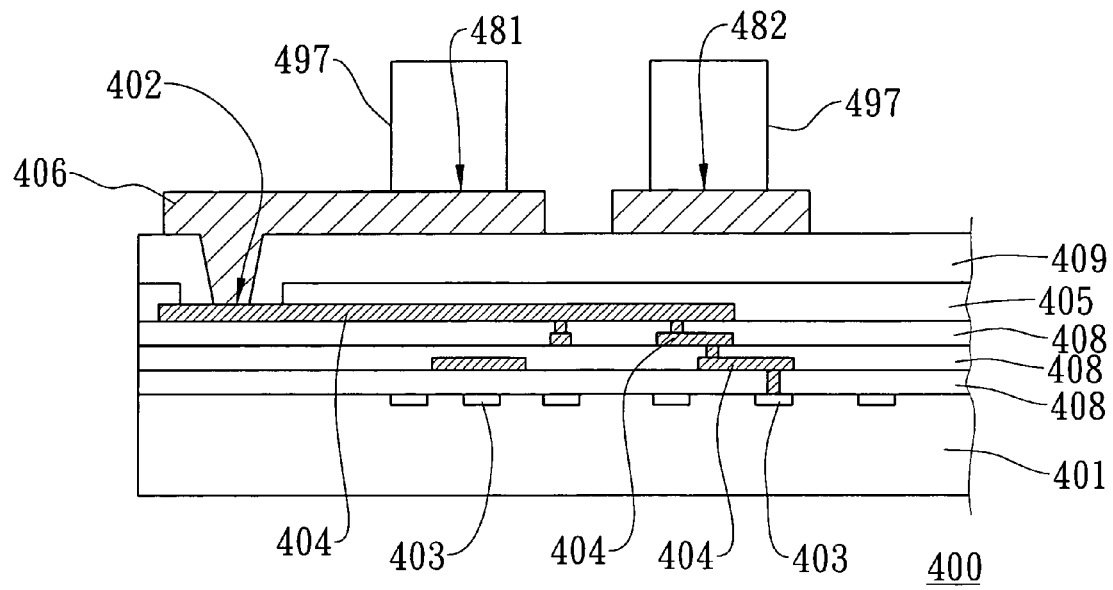
FIGS. 7-9 illustrate cross-sectional views of alternative semiconductor chips according to the invention.
Figure 8:
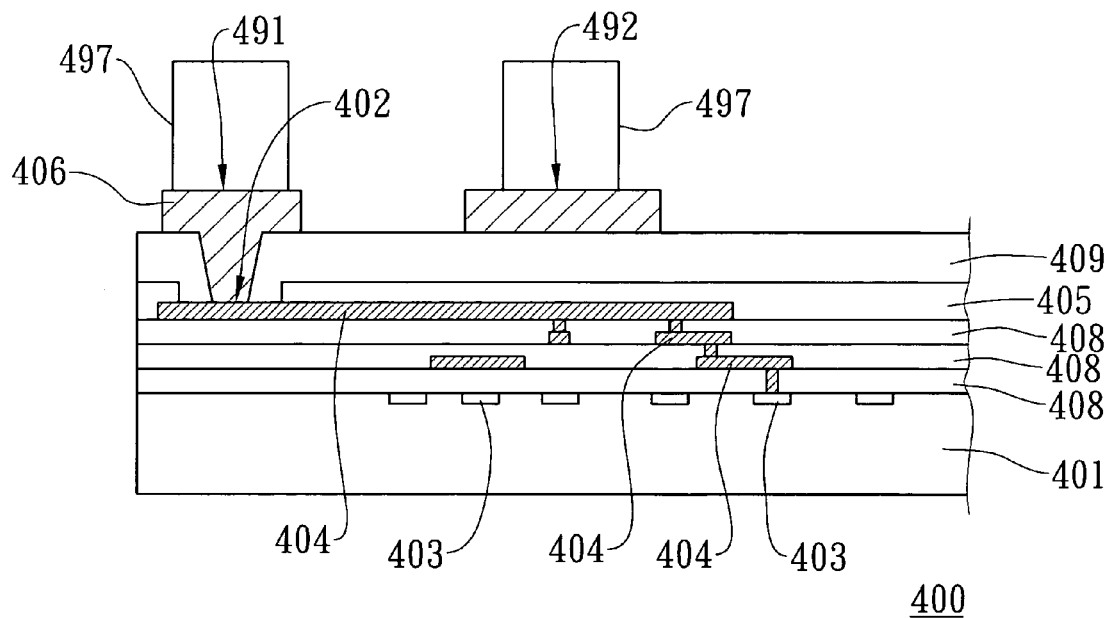

FIGS. 7 and 8 are an embodiment of the invention to show cross-sectional views of semiconductor chips. The elements shown in FIGS. 7 and 8 can be as referred to those shown in FIGS. 4A and 4B with same reference numbers. The difference from the above embodiments is that the contact pad 402 exposed by the opening in the passivation layer 405 is over a peripheral region of the semiconductor substrate 401 having no semiconductor devices 402, such as CMOS devices, transistors, capacitors, resistors or inductors. A polymer layer 409 is formed on the passivation layer 405 and on the contact pad 402 exposed by the openings in the passivation layer 405, an opening in the polymer layer 409 exposing the contact pad 402 exposed by the opening in the passivation layer 405.

In FIG. 7, the contact pads 481 and 482 used to be wirebonded thereto or have metal bumps 497 formed thereon are formed over the semiconductor devices 403 and not over the contact pads 402. The top view of FIG. 7 can be as referred to FIG. 4. The combinations for depositing the above-mentioned various metal bumps 497 or wires formed by a wirebonding process on the contact pads 481 and 482 aligned in the external and internal lines can be as referred to FIGS. 4A-4N. The process for forming the patterned metal layer 406 and the metal bumps 497 can be as referred to FIGS. 5A-5F. Optionally, the patterned metal layer 406 can be formed on the passivation layer 405 without the polymer layer 409 between the patterned metal layer 406 and the passivation layer 405.

In FIG. 8, the contact pads 491 used to be wirebonded thereto or have metal bumps 497 formed thereon, aligned in the external line, are formed over the contact pads and not over the semiconductor devices 403. The contact pads 492 used to be wirebonded thereto or have metal bumps 497 formed thereon, aligned in the internal line, are formed on the polymer layer 409 and over the semiconductor devices 403. The top view of FIG. 8 can be as referred to FIG. 6. The combinations for depositing the above-mentioned various metal bumps or wires formed by a wirebonding process on the contact pads 491 and 492 aligned in the external or internal lines can be as referred to FIGS. 4A-4N. The process for forming the patterned metal layer 406 and the metal bumps 497 can be as referred to FIGS. 5A-5F. Optionally, the patterned metal layer 406 can be formed on the passivation layer 405 without the polymer layer 409 between the patterned metal layer 406 and the passivation layer 405.

Figure 9:
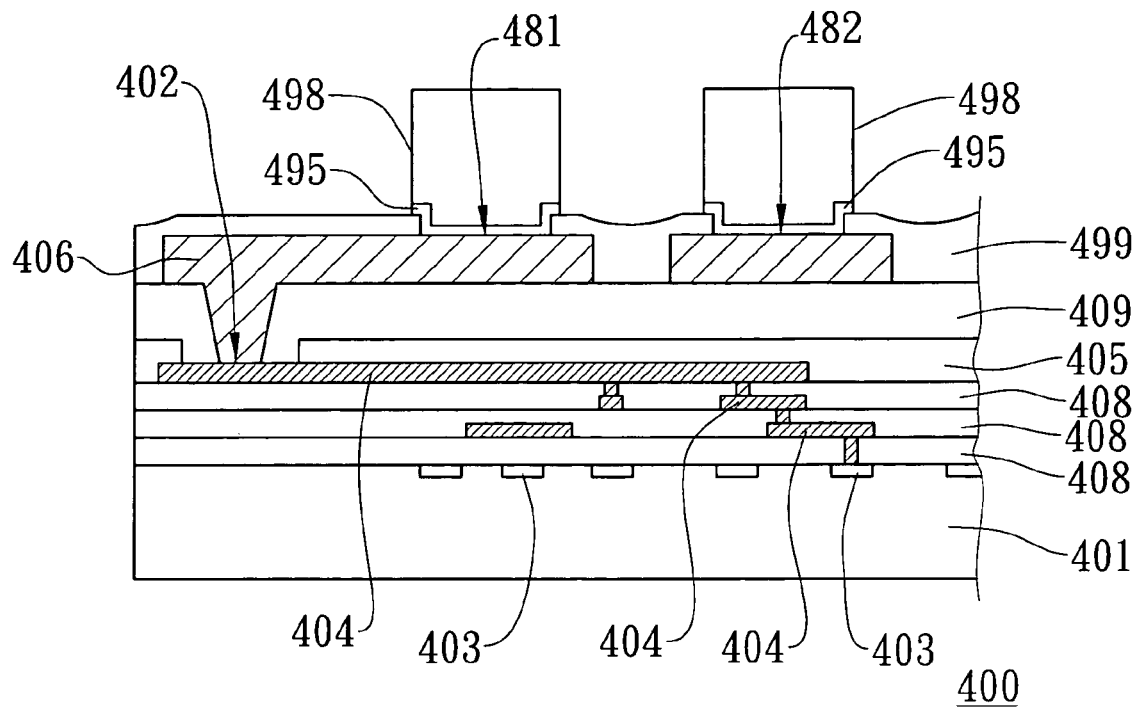

FIG. 9 is an embodiment of the invention to show a cross-sectional view of a semiconductor chip. For protecting the patterned metal layer 406, a polymer layer 499 can be deposited on the patterned metal layer 406, multiple openings in the polymer layer 499 exposing multiple contact pads 481 and 482 of the patterned metal layer 406. The top view of FIG. 9 can be as referred to FIG. 4. Alternatively, some of the contact pads of the RDL layer 406 can be formed over the contact pads 402 exposed by the openings in the passivation layer 405, the top view of which can be as referred to FIG. 6. After forming the polymer layer 409, multiple metal bumps 497 or wirebonded wires are deposited on the contact pads 481 and 482. The combinations for depositing the above-mentioned various metal bumps or wires formed by a wirebonding process on the contact pads 481 and 482 aligned in the external or internal lines can be as referred to FIGS. 4A-4N. Optionally, the patterned metal layer 406 can be formed on the passivation layer 405 without the polymer layer 409 between the patterned metal layer 406 and the passivation layer 405. The difference of the various metal bumps employed in the embodiment from those employed in FIGS. 4A-4N is that an adhesion/barrier layer 495 and a seed layer (not shown) are further formed on the contact pads 481 and 482 using a sputtering, evaporating or electroless plating process, as described below.

In an embodiment for forming metal bumps on the contact pads 481 and 482 with the polymer layer 499 formed on the patterned metal layer 406 as shown in FIG. 9, an adhesion/barrier layer 495, such as copper, nickel, gold, titanium, chromium or titanium-tungsten alloy, is formed on the polymer layer 499 and the contact pads 481 and 482 using a sputtering, evaporating or electroless-plating process. Next, a seed layer, such as gold, copper, nickel, platinum, palladium, ruthenium or rhodium, is formed on the adhesion/barrier layer using a sputtering, evaporating or electroless-plating process. Next, a PR layer is formed on the seed layer, multiple openings in the PR layer exposing the seed layer. Next, a bulk layer 498 having more than 95 percent by weight of gold, copper, nickel, platinum, palladium, ruthenium or rhodium, for example, and having a height of between 1 and 50 microns is formed on the seed layer exposed by the opening in the PR layer using an electroplating or electroless-plating process. Next, the PR layer is removed. Next, the seed layer and adhesion/barrier layer 495 not under the bulk layer 498 are removed. The metal bumps can be used to be wirebonded thereto or to be connected to electrical contact pads formed on a glass substrate, flexible substrate, TAB carrier, printed circuit board or another semiconductor chip.

In another embodiment for forming metal bumps on the contact pads 481 and 482 with the polymer layer 499 formed on the patterned metal layer 406 as shown in FIG. 9, an adhesion/barrier layer, such as copper, nickel, gold, titanium, chromium or titanium-tungsten alloy, is formed on the polymer layer and the contact pads using a sputtering, evaporating or electroless-plating process. Next, a seed layer, such as copper, is formed on the adhesion layer using a sputtering, evaporating or electroless-plating process. Next, a PR layer is formed on the seed layer, multiple openings in the PR layer exposing the seed layer. Next, a copper layer with more than 95 percent by weight of copper and with a thickness of between 0.5 and 10 microns is formed on the seed layer exposed by the openings in the PR layer using an electroplating or electroless-plating process. Next, a nickel layer with more than 95 percent by weight of nickel and with a thickness of between 0.5 and 10 microns is formed on the copper layer exposed by the openings in the PR layer using an electroplating or electroless-plating process. Next, a solder layer, such as tin-lead alloy, tin-silver alloy or tin-silver-copper alloy, having a thickness of between 25 and 500 microns is formed optionally on the nickel layer using an electroplating or electroless-plating process. Next, the PR layer is removed. Next, the seed layer and adhesion/barrier layer not under the solder layer are removed. Next, a reflow process is performed. The metal bumps can be used to be connected to the electrical contact pads formed on a glass substrate, flexible substrate, TAB carrier, printed circuit board or another semiconductor chip.

In another embodiment for forming metal bumps on the contact pads 481 and 482 with the polymer layer 499 formed on the patterned metal layer 406 as shown in FIG. 9, an adhesion/barrier layer, such as copper, nickel, gold, titanium, chromium or titanium-tungsten alloy, is formed on the polymer layer and the contact pads using a sputtering, evaporating or electroless-plating process. Next, a seed layer, such as gold, copper, nickel, platinum, palladium, ruthenium or rhodium, is formed on the adhesion layer using a sputtering, evaporating or electroless-plating process. Next, a PR layer is formed on the seed layer, multiple openings in the PR layer exposing the seed layer. Next, for forming metal posts, a layer of gold, copper, nickel, platinum, palladium, ruthenium or rhodium, for example, having a height of between 5 and 250 microns, and preferably between 50 and 100 microns, is formed on the seed layer exposed by the openings in the PR layer using an electroplating or electroless-plating process. Preferably, the metal posts are formed principally of copper, that is, the metal posts have more than 95 percent by weight of copper. Next, for forming a diffusion-barrier layer, a nickel layer having more than 95 percent by weight of nickel and having a height of between 0.5 and 10 microns is formed on the metal post exposed by the openings in the PR layer using an electroplating or electroless-plating process. Next, for forming solder caps, a solder layer, such as tin-lead alloy, tin-silver alloy, or tin-silver-copper alloy, having a height of between 10 and 200 microns is formed on the diffusion-barrier layer exposed by the openings in the PR layer using an electroplating or electroless-plating process. Next, the PR layer is removed. Next, the seed layer and adhesion/barrier layer not under the metal posts are removed. Next, a reflow process is performed. The metal bumps can be used to be connected to electrical contact pads formed on a glass substrate, flexible substrate, TAB carrier, printed circuit board or another semiconductor chip.

Figure 10:
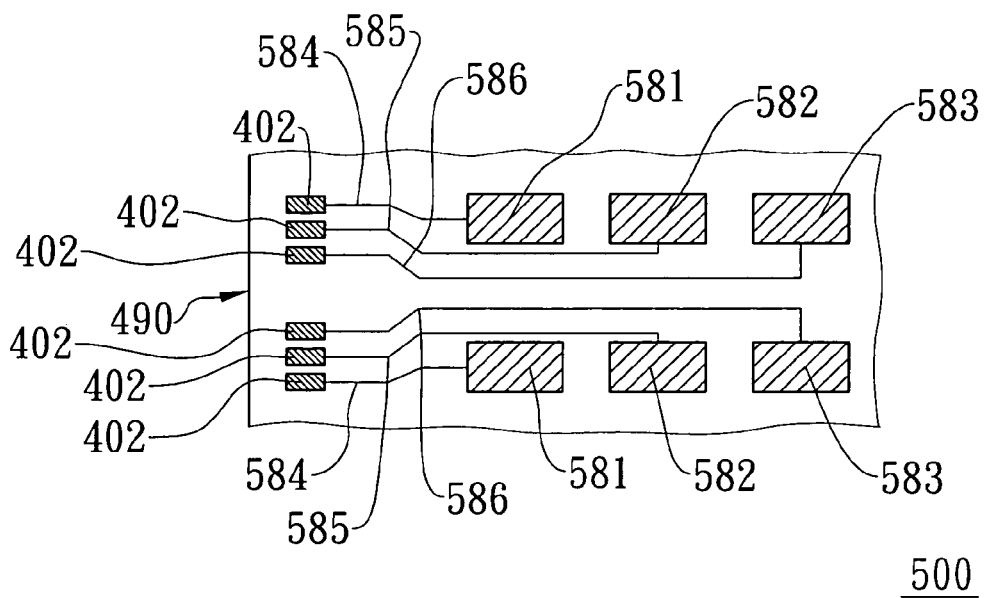
FIG. 10 illustrates a top view of an alternative semiconductor chip according to the invention.

FIG. 10 is an embodiment of the invention to show a top view of a semiconductor chip. The patterned metal layer formed over the passivation layer and on the contact pads exposed by the openings in the passivation layer includes multiple contact pads 581, 582 and 583 and traces 584, 585 and 586. The contact pads 581, 582 and 583 used to be wirebonded thereto or have metal bumps formed thereon can be aligned in three lines along an edge 490 of the semiconductor chip 500. Multiple traces 586 of the patterned metal layer connecting the contact pads 402 exposed by the openings in the passivation layer to the contact pads 583 aligned in the internal line pass through the gap between the neighboring contact pads 581 aligned in the external line and the gap between the neighboring contact pads 582 aligned in the middle line. Multiple traces 585 of the patterned metal layer connecting the contact pads 402 exposed by the openings in the passivation layer to the contact pads 582 aligned in the middle line pass through the gap between the neighboring contact pads 581 aligned in the external line. The process for forming the patterned metal layer and the metal bumps can be as referred to FIGS. 5A-5F. The patterned metal layer can be formed on the passivation layer without the polymer layer between the patterned metal layer and the passivation layer. Alternatively, the patterned metal layer can be formed on the polymer layer deposited on the passivation layer.

Preferably, the material of the metal bumps is soft and ductile to buffer and absorb the shock energy during assembling the semiconductor chip and an external circuitry or to buffer and absorb the shock energy during a probe or testing card is poked in the metal bumps. In accordance with the invention, the thicker the metal bumps are, the more energy the metal bumps absorb. The invention allows the semiconductor devices under the metal bumps without being damaged if a shock happens to the metal bumps.

The RDL layer is employed to change the I/O layout from the fine-pitched contact pads exposed by the opening in the passivation layer to the coarse-pitched contact pads formed over the fine-pitched contact pads or the passivation layer. Therefore, the process for wirebonding or forming metal bumps is easily performed.

In this invention, the peripheral region of the semiconductor substrate close to the edge thereof may have semiconductor devices formed therein or on. The rate of the semiconductor devices occupying the top surface of the semiconductor substrate is improved and therefore the semiconductor chip can be shrunk.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A chip comprising:
a silicon substrate;
a MOS device in or on said silicon substrate;
a first metal layer over said silicon substrate;
a second metal layer over said first metal layer;
a dielectric layer between said first and second metal layers;
a passivation layer over said first and second metal layers and over said dielectric layer, wherein said passivation layer comprises a nitride layer;
a first contact pad exposed by a first opening in said passivation layer;
a second contact pad exposed by a second opening in said passivation layer;
a third contact pad exposed by a third opening in said passivation layer, wherein said first, second and third contact pads are aligned in a first line, wherein said second contact pad is between said first and third contact pads;
a patterned metal layer over said first, second and third contact pads and over said passivation layer, wherein said patterned metal layer comprises a first gold layer having a thickness between 1 and 10 micrometers over said passivation layer and over said first, second and third contact pads, and wherein said patterned metal layer comprises a metal trace over said passivation layer, and a fourth contact pad connected to said second contact pad through said metal trace, wherein the position of said fourth contact pad from a top perspective view is different from that of said second contact pad;
a first metal bump on said patterned metal layer and over said first contact pad;
a second metal bump on said fourth contact pad; and
a third metal bump on said patterned metal layer and over said third contact pad, wherein said first and third metal bumps are aligned in a second line parallel with said first line, and wherein said first, second and third metal bumps all comprise a second gold layer, having more than 95 percent by weight of gold and having a height between 1 and 50 micrometers, directly on said first gold layer.

2. The chip of claim 1 further comprising a polymer layer between said patterned metal layer and said passivation layer.

3. The chip of claim 2, wherein said polymer layer comprises polyimide.

4. The chip of claim 2, wherein said polymer layer has a thickness between 3 and 10 micrometers.

5. The chip of claim 1, wherein said patterned metal layer further comprises a titanium-containing layer under said first gold layer.

6. The chip of claim 5, wherein said titanium-containing layer comprises tungsten.

7. The chip of claim 1, wherein said first, second and third metal bumps are used to be connected to multiple fifth contact pads on a glass substrate.

8. The chip of claim 1, wherein said first, second and third metal bumps are used to be connected to multiple fifth contact pads on a flexible substrate.

9. The chip of claim 1, wherein said first, second and third contact pads comprise aluminum.

10. The chip of claim 1, wherein said first, second and third contact pads comprise electroplated copper.

11. The chip of claim 1, wherein said nitride layer has a thickness between 0.2 and 1 micrometer.

12. The chip of claim 1, wherein said passivation layer further comprises an oxide layer under said nitride layer.

13. A chip comprising:
a silicon substrate;
a MOS device in or on said silicon substrate;
a first metal layer over said silicon substrate;
a second metal layer over said first metal layer;
a dielectric layer between said first and second metal layers;
a passivation layer over said first and second metal layers and over said dielectric layer, wherein said passivation layer comprises a nitride layer;
a first contact pad exposed by a first opening in said passivation layer;
a second contact pad exposed by a second opening in said passivation layer;
a third contact pad exposed by a third opening in said passivation layer, wherein said first, second and third contact pads are aligned in a first line, wherein said second contact pad is between said first and third contact pads;
a patterned metal layer over said first, second and third contact pads and over said passivation layer, wherein said patterned metal layer comprises a first gold layer having a thickness between 1 and 10 micrometers over said passivation layer and over said first, second and third contact pads, and wherein said patterned metal layer comprises a first metal trace over said passivation layer, a fourth contact pad connected to said first contact pad through said first metal trace, wherein the position of said fourth contact pad from a top perspective view is different from that of said first contact pad, a second metal trace over said passivation layer, a fifth contact pad connected to said second contact pad through said second metal trace, wherein the position of said fifth contact pad from said top perspective view is different from that of said second contact pad, a third metal trace over said passivation layer, and a sixth contact pad connected to said third contact pad through said third metal trace, wherein the position of said sixth contact pad from said top perspective view is different from that of said third contact pad, wherein said second metal trace passes through a gap between said fourth and sixth contact pads;
a first metal bump on said fourth contact pad;
a second metal bump on said fifth contact pad; and
a third metal bump on said sixth contact pad, wherein said first and third metal bumps are aligned in a second line parallel with said first line, and wherein said first, second and third metal bumps all comprise a second gold layer, having more than 95 percent by weight of gold and having a height between 1 and 50 micrometers, directly on said first gold layer.

14. The chip of claim 13, wherein said patterned metal layer further comprises a titanium-containing layer under said first gold layer.

15. The chip of claim 14, wherein said titanium-containing layer further comprises tungsten.

16. The chip of claim 13, wherein said first, second and third contact pads comprise aluminum.

17. The chip of claim 13, wherein said first, second and third contact pads comprise electroplated copper.

18. The chip of claim 13, wherein said nitride layer has a thickness between 0.2 and 1 micrometer.

19. The chip of claim 13 further comprising a polymer layer between said patterned metal layer and said passivation layer.

20. The chip of claim 19, wherein said polymer layer has a thickness between 3 and 10 micrometers.

* * * * *